United States Patent
Purtell et al.

(10) Patent No.: US 8,143,125 B2
(45) Date of Patent: Mar. 27, 2012

(54) STRUCTURE AND METHOD FOR FORMING A SALICIDE ON THE GATE ELECTRODE OF A TRENCH-GATE FET

(75) Inventors: Robert J. Purtell, West Jordan, UT (US); James J. Murphy, South Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 334 days.

(21) Appl. No.: 12/412,803

(22) Filed: Mar. 27, 2009

(65) Prior Publication Data
US 2010/0244126 A1   Sep. 30, 2010

(51) Int. Cl.
*H01L 21/336* (2006.01)

(52) U.S. Cl. ........ 438/270; 438/259; 438/268; 438/272; 438/589; 257/330; 257/332; 257/E21.41; 257/E21.419; 257/E21.428; 257/E21.655; 257/E29.201; 257/E29.257; 257/E29.26; 257/E29.262; 257/E29.274

(58) Field of Classification Search .................. 438/259, 438/268, 270, 272, 589; 257/330, 332, E21.41, 257/E21.419, E21.428, E21.429, E21.655, 257/E29.201, E29.257, E29.6, E29.262, E29.274
See application file for complete search history.

(56) References Cited

U.S. PATENT DOCUMENTS

| | | | |
|---|---|---|---|
| 5,801,417 A | 9/1998 | Tsang et al. | |
| 6,489,204 B1 | 12/2002 | Tsui | |
| 6,707,100 B2 | 3/2004 | Gajda | |
| 6,717,210 B2 | 4/2004 | Takano et al. | |
| 6,737,323 B2 | 5/2004 | Mo | |
| 6,930,355 B2 | 8/2005 | Matsuki et al. | |
| 6,969,888 B2 | 11/2005 | Williams et al. | |
| 7,084,033 B2 | 8/2006 | Hsu | |
| 7,109,552 B2 | 9/2006 | Wu | |
| 7,217,976 B2 | 5/2007 | Spring | |

(Continued)

FOREIGN PATENT DOCUMENTS

JP     2000-114516 A     4/2000

(Continued)

OTHER PUBLICATIONS

International Search Report of the International Searching Authority for Application No. PCT/US2010/027608, mailed on Sep. 30, 2010, 6 pages.

(Continued)

*Primary Examiner* — Benjamin Sandvik
*Assistant Examiner* — Farid Khan
(74) *Attorney, Agent, or Firm* — Kilpatrick Townsend & Stockton LLP (57) ABSTRACT

A method for forming a trench-gate FET includes the following steps. A plurality of trenches is formed extending into a semiconductor region. A gate dielectric is formed extending along opposing sidewalls of each trench and over mesa surfaces of the semiconductor region between adjacent trenches. A gate electrode is formed in each trench isolated from the semiconductor region by the gate dielectric. Well regions of a second conductivity type are formed in the semiconductor region. Source regions of the first conductivity type are formed in upper portions of the well regions. After forming the source regions, a salicide layer is formed over the gate electrode in each trench abutting portions of the gate dielectric. The gate dielectric prevents formation of the salicide layer over the mesa surfaces of the semiconductor region between adjacent trenches.

19 Claims, 5 Drawing Sheets

U.S. PATENT DOCUMENTS

| | | |
|---|---|---|
| 7,282,406 B2 | 10/2007 | Grivna et al. |
| 7,301,200 B2 | 11/2007 | Amali et al. |
| 7,345,342 B2 | 3/2008 | Challa et al. |
| 2002/0110984 A1 | 8/2002 | Liou et al. |
| 2002/0140027 A1 | 10/2002 | Mo et al. |
| 2002/0142616 A1* | 10/2002 | Giewont et al. ............... 438/745 |
| 2003/0168695 A1 | 9/2003 | Sodhi et al. |
| 2004/0041207 A1* | 3/2004 | Takano et al. ................. 257/330 |
| 2005/0208724 A1 | 9/2005 | Cao et al. |
| 2006/0113588 A1 | 6/2006 | Wu |
| 2006/0134858 A1* | 6/2006 | Yamazaki ..................... 438/243 |
| 2006/0214168 A1* | 9/2006 | Akimoto et al. ................ 257/59 |
| 2007/0037327 A1* | 2/2007 | Herrick et al. ................. 438/151 |
| 2007/0170498 A1 | 7/2007 | Hu et al. |
| 2007/0190728 A1* | 8/2007 | Sreekantham et al. ....... 438/270 |
| 2008/0009134 A1 | 1/2008 | Hung et al. |
| 2009/0020809 A1* | 1/2009 | Kitamura et al. ............. 257/330 |

FOREIGN PATENT DOCUMENTS

| | | |
|---|---|---|
| JP | 2000-188397 A | 4/2000 |
| KR | 100341214 B1 | 6/2002 |

OTHER PUBLICATIONS

Written Opinion of the International Searching Authority for Application No. PCT/US2010/027608, mailed on Sep. 30, 2010, 4 pages.

\* cited by examiner

STRUCTURE AND METHOD FOR FORMING A SALICIDE ON THE GATE ELECTRODE OF A TRENCH-GATE FET

BACKGROUND OF THE INVENTION

The present invention relates in general to semiconductor technology, and more particularly, to a structure and method for forming a salicide on the gate electrode of a trench-gate field effect transistor (FET).

Conventional metal-oxide-semiconductor (MOS) integrated circuits often utilize a low resistance titanium silicide layer on the polysilicon gate electrode to reduce gate resistance. The titanium silicide layer is generally formed using a self-aligned process. A thin layer of titanium is deposited on the wafer and the wafer is heated. The titanium reacts with exposed silicon to form a titanium silicide. Areas not exposed to silicon do not react, and the un-reacted titanium is removed during subsequent cleaning processes. A silicide formed by such a process may be referred to as a salicide, which is a term used in the art to refer to a self-aligned silicide.

Conventional MOS integrated circuits utilizing a titanium salicide layer require spacers. The spacers provide a physical and electrical barrier between the titanium salicide and nearby conductive layers to prevent shorting and bridging. In a conventional trench-gate FET, spacers are formed adjacent to the gate dielectric along the trench sidewalls to isolate the titanium salicide from the source regions. Without spacers, the titanium used to form titanium salicide can react with the silicon in the gate dielectric to form titanium silicide stringers that cause shorting between the titanium salicide and the source regions. Also, titanium silicide growth is isotropic, and the salicide layer can extend laterally causing bridging.

Using spacers, however, reduces the cross-sectional area of the salicide layer thus increasing gate resistance. Also, with trench-gate FETs the dielectric layer covering mesa surfaces adjacent to the trench is typically removed during spacer etch, thus allowing salicide to form on the mesa surfaces. Salicide formed on the mesa surfaces is difficult to remove thus impacting subsequent contact etch processes.

Thus, there is a general need for improved structures and methods for forming a salicide on the gate electrode of a trench-gate FET.

SUMMARY OF THE INVENTION

In accordance with an embodiment of the invention, trench-gate FET structures may be formed as follows. A plurality of trenches is formed extending into a semiconductor region. A gate dielectric is formed extending along opposing sidewalls of each trench and over mesa surfaces of the semiconductor region between adjacent trenches. A gate electrode is formed in each trench isolated from the semiconductor region by the gate dielectric. Well regions of a second conductivity type are formed in the semiconductor region. Source regions of the first conductivity type are formed in upper portions of the well regions. After forming the source regions, a salicide layer is formed comprising at least one of cobalt or nickel over the gate electrode in each trench abutting portions of the gate dielectric. The gate dielectric prevents formation of the salicide layer over the mesa surfaces of the semiconductor region between adjacent trenches.

In one embodiment, the salicide layer comprises at least one of cobalt, nickel, or molybdenum.

In another embodiment, forming the well regions comprises performing a thermal process substantially without oxygen to minimize oxide formation over the gate electrode.

In another embodiment, forming the source regions comprises performing a thermal process substantially without oxygen to minimize oxide formation over the gate electrode.

In yet another embodiment, a wet clean process is performed without HF to minimize removal of exposed portions of the gate dielectric.

In accordance with another embodiment of the invention, a trench-gate FET structure comprises trenches extending into a semiconductor region with portions of the semiconductor region extending between adjacent trenches forming mesa surfaces. The semiconductor structure also comprises a continuous gate dielectric extending along sidewalls of each trench and over the mesa surfaces, and a gate electrode in each trench isolated from the semiconductor region by the gate dielectric. The semiconductor structure also comprises a salicide layer comprising at least one of cobalt or nickel extending over the gate electrode in each trench and abutting portions of the gate dielectric. The semiconductor structure also comprises a dielectric layer over the salicide layer in each trench, and an interconnect layer over the dielectric layer and over portions of the gate dielectric extending over the mesa surfaces.

In one embodiment, the semiconductor structure further comprises well regions of a second conductivity type in the semiconductor region and source regions of a first conductivity type in upper portions of the well regions. The well regions and the source regions are adjacent to the sidewalls of each trench, and the salicide layer in each trench overlaps bottom portions of adjacent source regions along a depth of the trenches.

In another embodiment, the portions of the gate dielectric extending over the mesa surfaces isolate the interconnect layer from the semiconductor region, and the dielectric layer isolates the interconnect layer from the salicide layer.

In yet another embodiment, a top surface of the salicide layer in each trench is recessed relative to the mesa surfaces.

The following detailed description and the accompanying drawings provide a better understanding of the nature and advantages of the present invention.

DETAILED DESCRIPTION OF THE INVENTION

In accordance with embodiments of the present invention, trench-gate FET structures with reduced gate resistance are obtained using simple manufacturing processes. Some embodiments include forming a salicide layer comprising cobalt or nickel over the gate electrode. Cobalt and nickel do not react with the silicon in silicon oxide to form stringers in the same manner as titanium, and thus spacers can be eliminated. Eliminating spacers increases the cross-sectional area of the salicide layer thus reducing gate resistance. Other embodiments include forming the source and well regions prior to salicide formation. Source and well formation require high temperature processing. Salicide layers have generally low thermal stability, and forming the salicide layer after source and well formation prevents exposure of the salicide layer to the high temperature processing. Other embodiments include forming source and well regions using thermal processes substantially without oxygen to minimize oxide formation over the gate electrode. A thin oxide over the gate electrode can be removed prior to salicide formation while minimizing removal of exposed portions of the gate dielectric. Thus, the remaining portions of the gate dielectric extending along upper trench sidewalls can prevent shorting between the salicide layer and the source region. Also, by eliminating spacers the gate dielectric extending over mesa surfaces is not removed during spacer etch. The gate dielectric prevents salicide formation on the mesa surfaces thus improving contact etch processes.

In yet other embodiments, a wet clean process without HF may be used between implant steps and thermal processes. The wet clean removes less dielectric than conventional wet clean processes using HF. The remaining portions of the gate dielectric along the upper trench sidewalls can prevent shorting between the salicide layer and the source regions. This eliminates the need for spacers, thus increasing the cross-sectional area of the salicide and reducing gate resistance. Also, the remaining portions of the gate dielectric extending over mesa surfaces prevent salicide formation on the mesa surfaces, thus improving contact etch processes. These and other embodiments of the invention, as well as other features and advantages, are described in more detail below.

FIGS. 1A-1J show simplified cross-sectional views at various steps of forming a trench-gate FET structure with a salicide layer on the gate electrode in accordance with embodiments of the invention. It should be understood that the structures illustrated in FIGS. 1A-1J are exemplary, and the scope of the invention is not limited to these specific examples. Also, the dimensions in the figures of this application are not to scale, and at times the relative dimensions are exaggerated or reduced in size to more clearly show various structural features. Additionally, while only two trenches are shown in each figure, it is to be understood that the structure illustrated may be replicated many times in an actual semiconductor device.

Figure 1A:
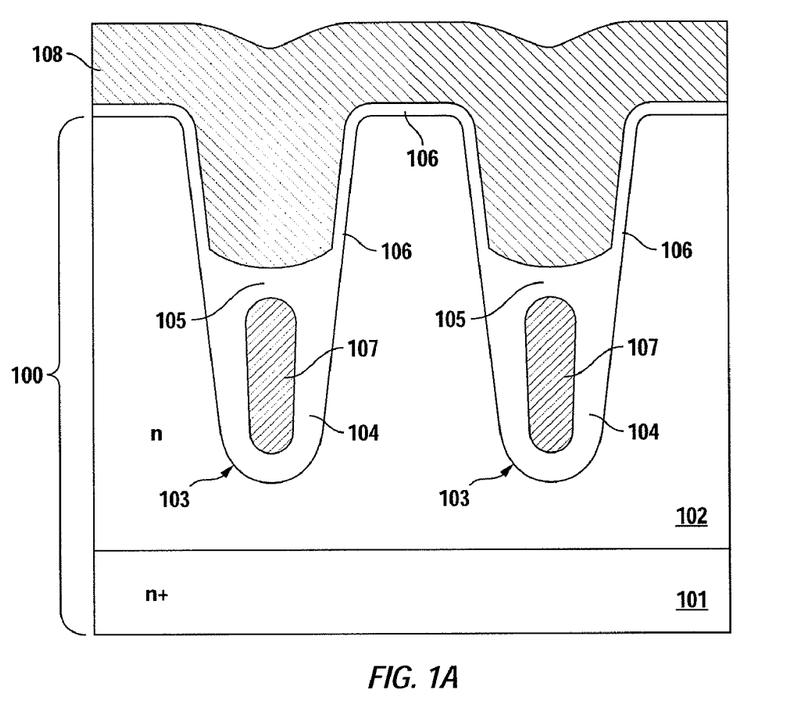
FIGS. 1A-1J show simplified cross-sectional views at various steps of forming a trench-gate FET structure with a salicide layer on the gate electrode in accordance with embodiments of the invention.

In FIG. 1A, trenches 103 are formed in semiconductor region 100 using conventional photolithography and etch techniques. In one embodiment, semiconductor region 100 includes an n-type epitaxial layer 102 extending over a highly doped n+ type substrate 101. In some embodiments, trenches 103 extend into and terminate within epitaxial layer 102. In other embodiments, trenches 103 extend through epitaxial layer 102 and terminate within substrate 101.

Shield dielectric 104 and shield electrode 107 are formed in the bottom portion of trenches 103 using known techniques. In one embodiment, formation of shield dielectric 104 may include forming a dielectric layer along the sidewalls and bottom of trenches 103 using a conventional oxide deposition or thermal oxidation process. Formation of shield electrode 107 may include forming a layer of polysilicon over the dielectric layer to fill trenches 103. The dielectric and polysilicon layers may then be etched using known techniques to recess the layers in the bottom portion of trenches 103 and thus form shield dielectric 104 and shield electrode 107.

Inter-electrode dielectric (IED) 105, gate dielectric 106, and polysilicon layer 108 may also be formed in trenches 103 using known techniques. For example, formation of IED 105 may include forming a dielectric layer along the upper sidewalls of trenches 103 and over shield electrode 107 using conventional deposition or thermal oxidation processes. The dielectric layer may be etched using known techniques to recess the layer and form IED 105 extending over shield electrode 107. Gate dielectric 106 may be formed along the upper sidewalls of trenches 103 and over adjacent mesa surfaces using conventional deposition or thermal oxidation processes. The formation of polysilicon layer 108 may include depositing a polysilicon layer over IED 105 and gate dielectric 106 using a conventional polysilicon deposition process.

Figure 1B:
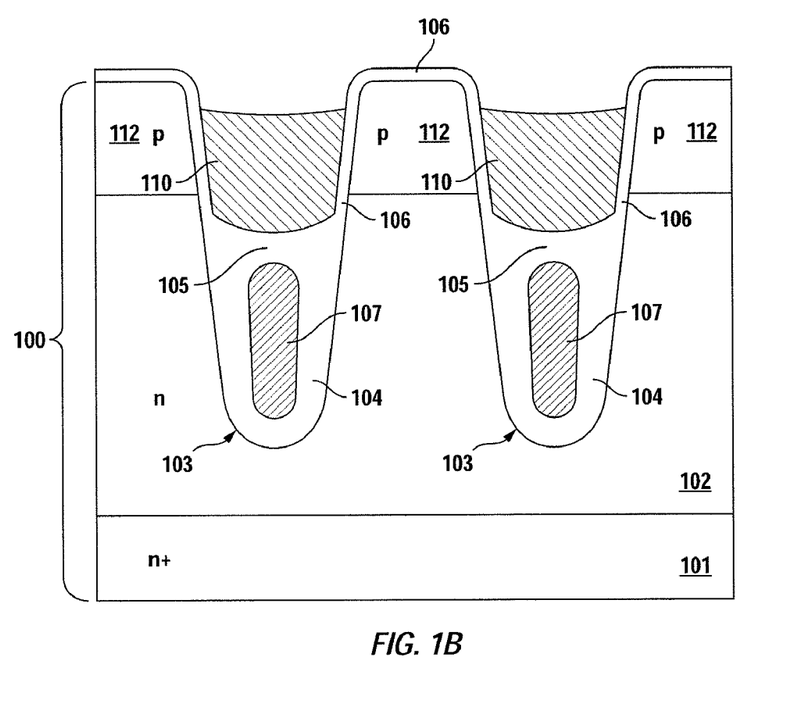

In FIG. 1B, one or more conventional polysilicon etch or chemical mechanical polishing (CMP) processes may be used to remove polysilicon layer 108 from over the mesa surfaces between adjacent trenches 103 and form gate electrode 110 in each trench. Also shown in FIG. 1B, well regions 112 may be formed in an upper portion of semiconductor region 100. Formation of well regions 112 may include implanting p-type dopants into an upper portion of semiconductor region 100 using a conventional well implant process. In one embodiment, a wet clean without HF is used after the implant step to clean the surface of the structure prior to high temperature processing. For example, a conventional SC1/SC2 clean without HF may be used. The clean preserves exposed portions of gate dielectric 106 along the upper sidewalls of trenches 103 and over the mesa surfaces. In another embodiment, a thermal process substantially without oxygen may be used to activate the dopants and form well regions 112. For example, the thermal process may use only inert gases such as nitrogen or argon during a high temperature drive step. This minimizes oxide formation over the gate electrode. The length of the process and the temperature of the process may be determined according to known techniques.

Figure 1C:
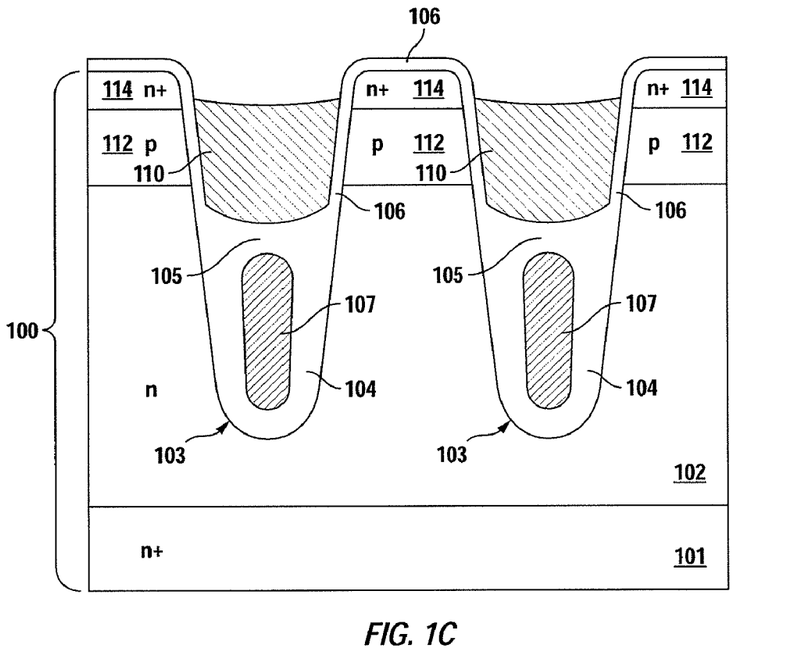

In FIG. 1C, source regions 114 are formed in an upper portion of semiconductor region 100. For example, a conventional source implant process may be used to implant n-type dopants into an upper portion of semiconductor region 100. In one embodiment, a wet clean without HF may be used after the implant to clean the surface of the structure prior to high temperature processing. For example, a conventional SC1/SC2 clean without HF may be used to preserve exposed portions of gate dielectric 106. In another embodiment, a thermal process substantially without oxygen may be used to activate the dopants and form source regions 114. The thermal process may use only inert gases such as nitrogen or argon during the high temperature drive step to minimize oxide formation over the gate electrode. The length of the process and the temperature of the process may be determined according to known techniques.

In an alternative embodiment, conventional well and source implant steps may be performed as described above. After the implant steps, a wet clean without HF may be used to clean a surface of the structure prior to high temperature processing. A thermal process substantially without oxygen may then be used to activate the dopants and form well regions 112 and source regions 114.

In yet another embodiment, a conventional well implant step may be performed as described above. After the well implant step, a wet clean without HF may be used to clean the surface of the structure. A conventional source implant step may be performed as described above. After the source implant step, a wet clean without HF may be used to clean the surface of the structure. A thermal process substantially without oxygen may then be used to activate the dopants and form well regions 112 and source regions 114. Alternatively, the source implant may be performed prior to the well implant in any of the above embodiments. One of ordinary skill in the art would recognize many variations, modifications, and alternatives.

Figure 1D:
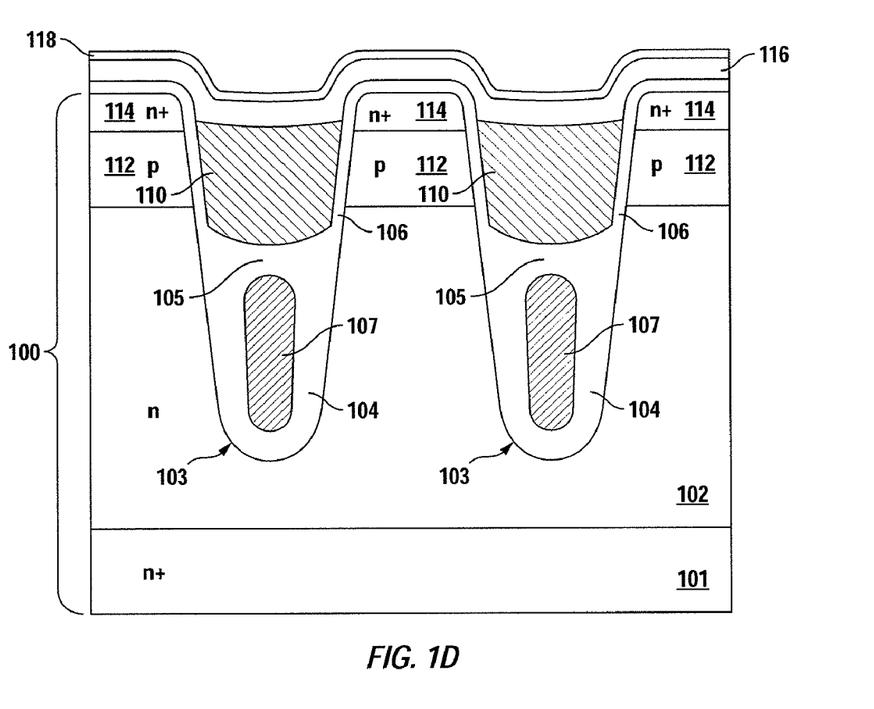

In FIG. 1D, metal layer 116 and cap layer 118 are formed over the structure using known techniques. In one embodiment, a cleaning process may be used prior to forming metal layer 116 to remove oxide from the surface of gate electrode 110. The cleaning process may include one or more conventional wet or dry etch processes. For example, in one embodiment a wet etch process using a sulfuric peroxide mix (SPM)

etch followed by a dilute HF etch may be used. Tests have shown that this process can enable formation a salicide layer with low sheet resistance and low resistivity. The cleaning process can be carefully designed to remove the oxide from the surface of gate electrode 110 with minimal impact on the exposed portions of gate dielectric 106.

In one embodiment, metal layer 116 is formed using a conventional metal deposition process. Metal layer 116 contacts an upper surface of gate electrode 110 and extends over gate dielectric 106 along the upper sidewalls of trenches 103 and over the mesa surfaces. Metal layer 116 may comprise titanium, cobalt, nickel, molybdenum or other metals or alloys suitable for salicide formation. Cap layer 118 may be formed over metal layer 116 to prevent oxidation of metal layer 116 during subsequent processing. In one embodiment, cap layer 118 may comprise titanium or titanium nitride and be formed over metal layer 116 using a conventional deposition process.

In one embodiment, a metal layer comprising cobalt, nickel, or molybdenum is used to form metal layer 116. The salicides of these metals do not react with the silicon in silicon oxide to form stringers in the same manner as titanium, thus reducing shorts and eliminating the need for spacers. Also, the differential etch between these metals and their respective salicides allow them to be used in self-aligned processes. This is in contrast to metals such as tungsten, which cannot be used to form a salicide because the unreacted metal cannot be removed without also removing the silicide. Thus, tungsten silicide requires separate photo and etch processing, and does not provide the device scaling of a self-aligned process.

Figure 1E:
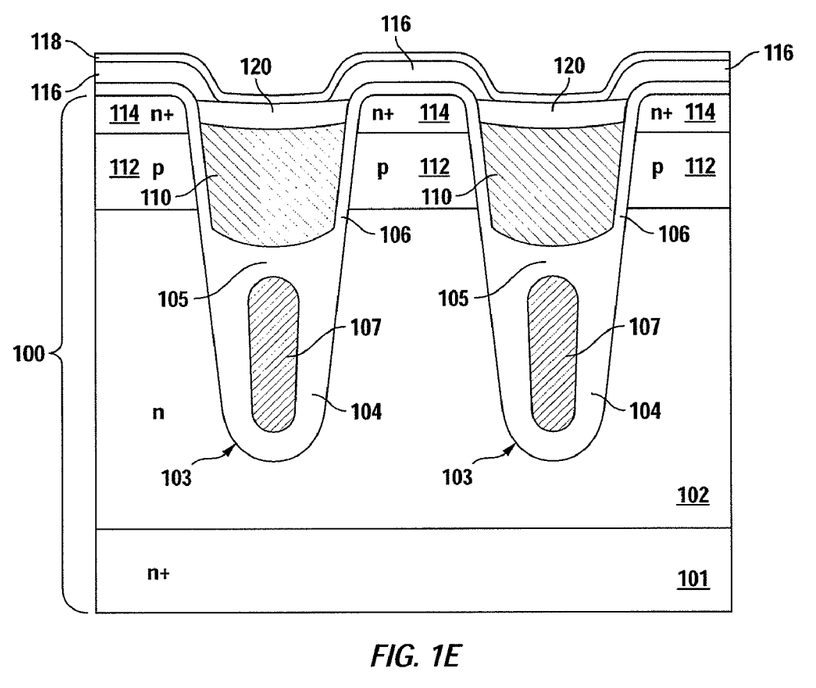

In FIG. 1E, mono-silicide layer 120 is formed over gate electrode 110 using known techniques. For example, in one embodiment a conventional rapid thermal anneal (RTA) process at a temperature of between about 475-600° C. for between about 20-40 seconds may be used to react portions of metal layer 116 with silicon from gate electrode 110 to form mono-silicide layer 120. As shown in FIG. 1E, portions of metal layer 116 extending over gate dielectric 106 and cap layer 118 remain unreacted. Portions of gate dielectric 106 extending over mesa surfaces prevent salicide formation on the mesa surfaces.

Figure 1F:
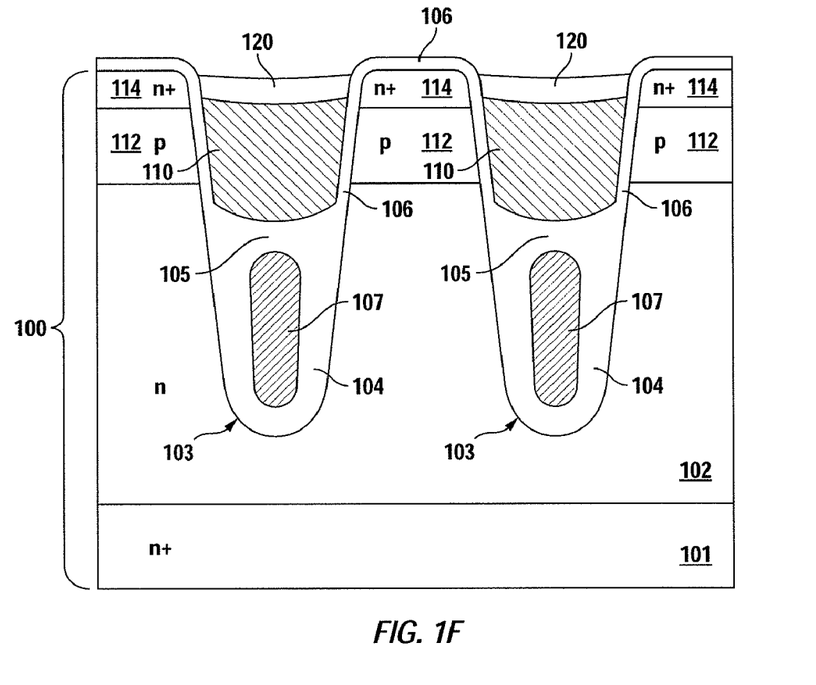

In FIG. 1F, cap layer 118 and unreacted portions of metal layer 116 are removed using known techniques. For example, in an embodiment one or more conventional wet or dry etch processes may be used to remove cap layer 118 and the unreacted portions of metal layer 116. The etch processes are selective and do not remove mono-silicide layer 120 or the exposed portions of gate dielectric 106 extending over the mesa surfaces.

Figure 1G:
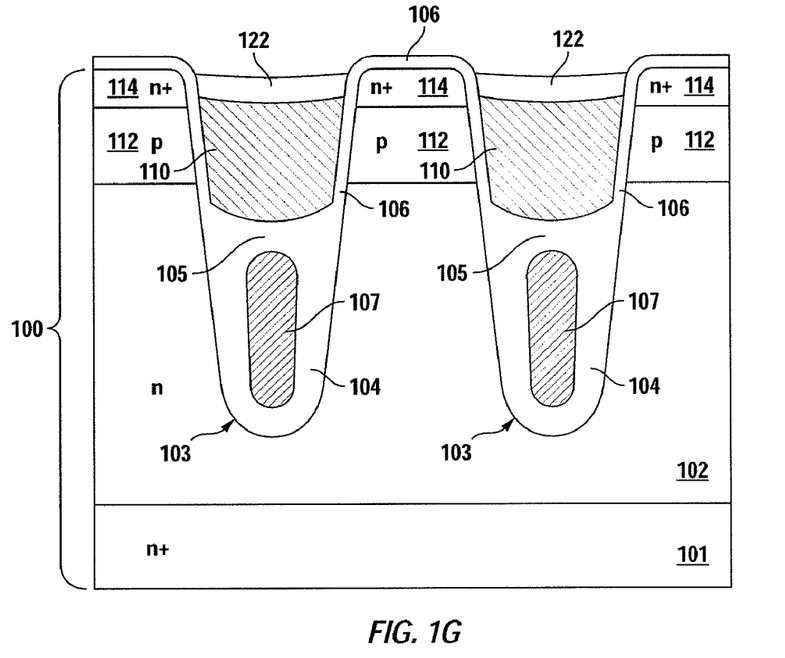

In FIG. 1G, salicide layer 122 is formed over gate electrode 110 using known techniques. For example, in one embodiment a conventional RTA process at a temperature of between about 700-800° C. may be used to convert mono-silicide layer 120 to salicide layer 122. As shown in FIG. 1G, salicide layer 122 may abut portions of gate dielectric 106 thus increasing the cross-sectional area of salicide layer 122. In one embodiment, the thickness of mono-silicide layer 120 can be carefully designed such that a bottom surface of salicide layer 122 overlaps a bottom portion of source regions 114 along a depth of trenches 103. This can increase the volume of salicide layer 122 and further decrease gate resistance. In another embodiment, the top surface of salicide layer 122 is recessed relative to the adjacent mesa surfaces.

Figure 1H:
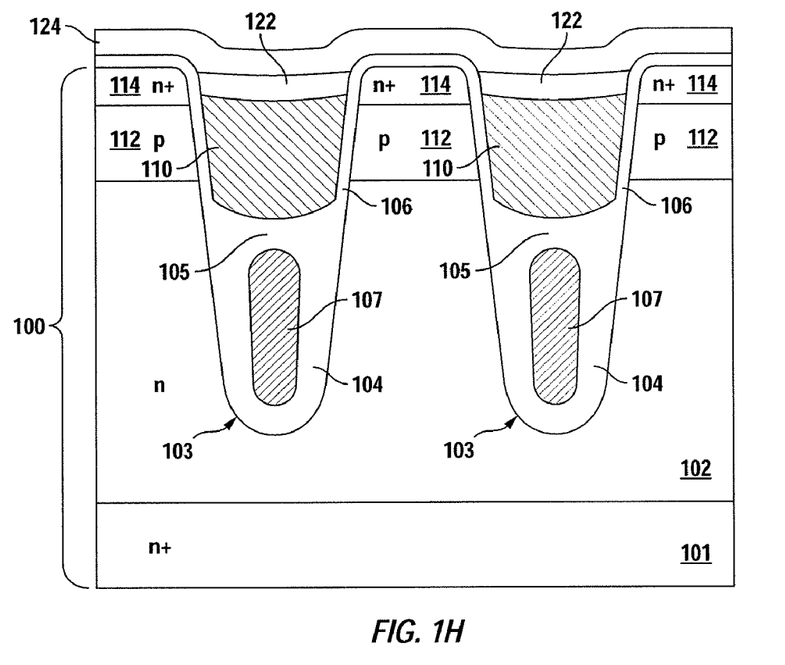
Figure 1I:
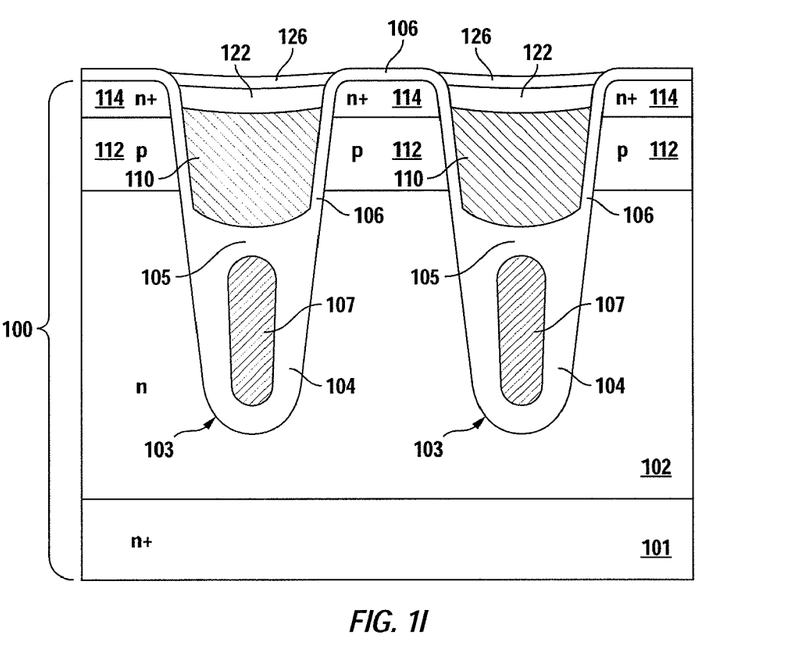

In FIG. 1H, dielectric layer 124 is formed over the structure using known techniques. For example, in one embodiment a conventional dielectric deposition process may be used to deposit dielectric layer 124 over salicide layer 122 and the exposed portions of gate dielectric 106 extending over the mesa surfaces. In an embodiment, one or more conventional dielectric etch or CMP processes may be used to remove dielectric layer 124 from over the mesa surfaces and form self-aligned dielectric layer 126 over salicide layer 122. In other embodiments, conventional photolithography and etch techniques may be used to remove dielectric layer 124 from over the mesa surfaces.

Figure 1J:
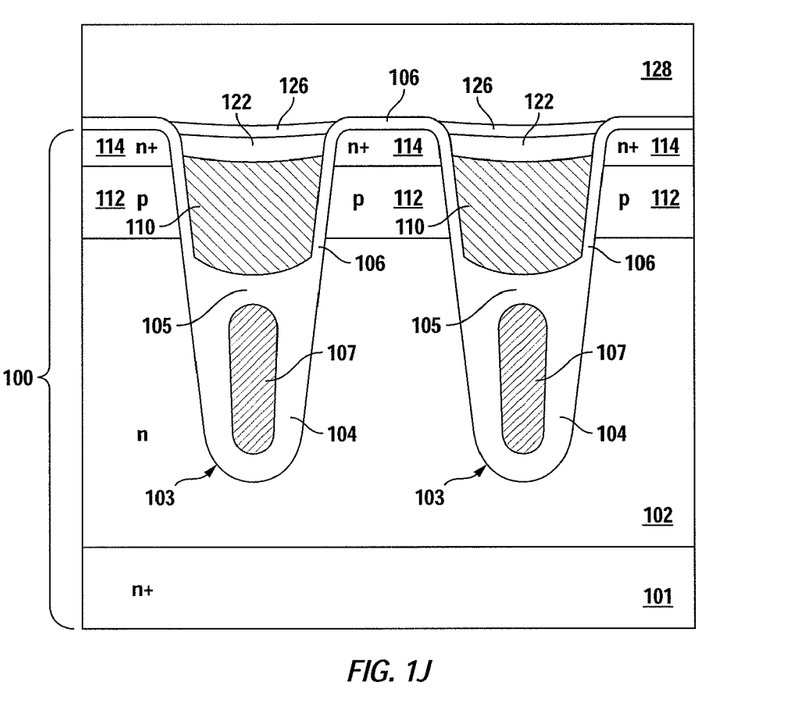

In FIG. 1J, interconnect layer 128 (e.g., comprising metal) is formed over the topside of the structure using known techniques. The portions of gate dielectric 106 extending over the mesa surfaces between adjacent trenches isolate source regions 114 from interconnect layer 128. The high quality gate dielectric 106 improves isolation between the mesa surfaces and interconnect layer 128. Interconnect layer 128 contacts source regions 114 at source contacts along a third dimension (e.g., the dimension into the page). This increases device density by eliminating stripe-shaped source contacts between trenches 103. A bottom-side conductive interconnect layer (not shown), e.g., comprising metal, that electrically contacts the backside of semiconductor region 100 may also be formed using known techniques.

Structures formed according to embodiments of the present invention enjoy, among other advantages and features, elimination of spacers (by forming a salicide layer comprising cobalt, nickel, or molybdenum, by minimizing oxide formation over the gate electrode during formation of source and well regions, and/or by preserving gate dielectric thickness along upper trench sidewalls during cleaning processes), prevention of salicide formation on mesa surfaces (by preserving gate dielectric thickness over mesa surfaces), reduction in gate resistance (by increasing cross-sectional area and volume of the salicide layer), improved contact etch processes (by preventing salicide formation on mesa surfaces), increased device density and scalability (by eliminating spacers and stripe-shaped source contacts between each trench), and reduced process complexity (by eliminating spacer deposition and etch processes). Further, embodiments of the invention described herein advantageously form salicide layer 122 after formation of well regions 112 and source regions 114, thus preventing exposure of salicide layer 122 to the thermal processes associated with well and source formation. This allows the use of salicides comprising cobalt or nickel, which have a lower thermal stability than titanium salicide.

The trench-gate FET structures illustrated in FIGS. 1A-1J include a shielded gate. It is to be understood that methods of the present invention can be applied to conventional non-shielded trench-gate FET devices.

Note that while the embodiments depicted in FIGS. 1A-1J shows n-channel trench-gate FETs, p-channel trench-gate FETs may be obtained by reversing the polarity of the source and well regions, the epitaxial layer, and the substrate. Further, in embodiments where the semiconductor region includes an epitaxial layer extending over a substrate, MOSFETs devices are obtained when the substrate and epitaxial layer are of the same conductivity type, while IGBTs devices are obtained when the substrate has the opposite conductivity type to that of the epitaxial layer.

Furthermore, while the various embodiments described above are implemented in conventional silicon, these embodiments and their obvious variants can also be implemented in silicon carbide, gallium arsenide, gallium nitride, diamond, or other semiconductor materials. Additionally, the features of one or more embodiments of the invention may be combined with one or more features of other embodiments of the invention without departing from the scope of the invention.

Therefore, the scope of the present invention should be determined not with reference to the above description, but should instead be determined with reference to the appended claims along with their full scope of equivalents.

What is claimed is:

1. A method of forming a trench-gate FET structure, the method comprising:
   forming a plurality of trenches extending into a semiconductor region;
   forming a gate dielectric layer extending continuously along opposing sidewalls of each trench and over mesa surfaces of the semiconductor region between adjacent trenches;
   forming a gate electrode inside each trench;
   forming well regions of a second conductivity type ill the semiconductor region;
   forming source regions of the first conductivity type in upper portions of the well regions;
   after forming the source regions, forming a concave-shaped salicide layer comprising at least one of cobalt or nickel over the gate electrode inside each trench abutting portions of the gate dielectric layer, wherein the gate dielectric layer prevents formation of the salicide layer over the mesa surfaces of the semiconductor region between the adjacent trenches;
   forming a dielectric layer over the concave-shaped salicide layer in each trench; and
   forming an interconnect layer over the dielectric layer, the dielectric layer isolating the interconnect layer from the concave-shaped salicide layer and portions of the gate dielectric layer isolating the interconnect layer from the mesa surfaces between the adjacent trenches.

2. The method of claim 1, wherein the concave-shaped salicide layer comprises at least one of cobalt, nickel, or molybdenum.

3. The method of claim 1, wherein forming the well regions comprises performing a thermal process substantially without oxygen to minimize oxide formation over the gate electrode in each trench.

4. The method of claim 1, wherein forming the source regions comprises performing a thermal process substantially without oxygen to minimize oxide formation over the gate electrode in each trench.

5. The method of claim 1, further comprising:
   performing a wet clean process without HF to minimize removal of exposed portions of the gate dielectric layer.

6. The method of claim 1, wherein the source regions are formed adjacent to the opposing sidewalls of each trench, and the concave-shaped salicide layer in each trench overlaps bottom portions of the adjacent source regions along a depth of the plurality of trenches.

7. The method of claim 1, wherein forming the concave-shaped salicide layer comprises:
   forming a metal layer extending over exposed portions of the gate dielectric layer and over the gate electrode in each trench;
   performing a thermal process such that portions of the metal layer extending over the gate electrode in each trench react to form the concave-shaped salicide layer; and
   removing unreacted portions of the metal layer.

8. The method of claim 1, further comprising:
   forming a shield electrode in each trench under the gate electrode; and
   forming an inter-electrode dielectric in each trench extending between the shield electrode and the gate electrode.

9. A method of forming a trench-gate FET structure, the method comprising:
   forming a trench extending into the semiconductor region;
   forming a gate dielectric layer along sidewalls of the trench and extending continuously over mesa surfaces of the semiconductor region adjacent to the trench; forming a gate electrode inside the trench;
   performing a first implant of dopants of the first conductivity type into the semiconductor region;
   performing a second implant of dopants of a second conductivity type into the semiconductor region;
   performing one or more thermal processes to thereby form a source region corresponding to the first implant and a well region corresponding to the second implant, the one or more thermal processes being performed substantially without oxygen to minimize oxide formation over the gate electrode;
   after performing the thermal process, forming a concave-shaped salicide layer comprising at least one of cobalt or nickel over the gate electrode abutting portions of the gate dielectric layer, wherein the gate dielectric layer prevents formation of the salicide layer along the mesa surfaces of the semiconductor region;
   forming a dielectric layer over the concave-shaped salicide layer in each trench; and
   forming an interconnect layer over the dielectric layer, the dielectric layer isolating the interconnect layer from the concave-shaped salicide layer and portions of the gate dielectric layer isolating the interconnect layer from the source regions between adjacent trenches.

10. The method of claim 9, wherein the concave-shaped salicide layer comprises at least one of cobalt, nickel. or molybdenum.

11. The method of claim 9, wherein the concave-shaped salicide layer overlaps a bottom portion of the source region along a depth of the trench.

12. The method of claim 9, further comprising:
    performing a wet clean process without HF to minimize removal of exposed portions of the gate dielectric layer.

13. The method of claim 9, wherein forming the concave-shaped salicide layer comprises:
    forming a metal layer extending over exposed portions of the gate dielectric layer and the gate electrode;
    performing a second thermal process such that portions of the metal layer extending over the gate electrode react to form a mono-silicide;
    removing unreacted portions of the metal layer; and
    performing a third thermal process such that the mono-silicide reacts to form the concave-shaped salicide layer.

14. A trench-gate FET structure comprising:
    trenches extending into a semiconductor region, wherein portions of the semiconductor region extending between adjacent trenches form mesa surfaces;
    a gate dielectric layer extending continuously along sidewalls of each trench and over the mesa surfaces between the trenches;
    a gate electrode inside each trench;
    a concave-shaped salicide layer comprising at least one of cobalt or nickel extending over the gate electrode inside each trench and abutting portions of the gate dielectric layer;
    a dielectric layer over the concave-shaped salicide layer in each trench; and an interconnect layer over the dielectric layer and over portions of the gate dielectric layer extending over the mesa surfaces between the adjacent trenches.

15. The trench-gate FET structure of claim 14, wherein the concave-shaped salicide layer comprises at least one of cobalt, nickel, or molybdenum.

16. The trench-gate FET structure of claim 14, further comprising:
well regions of a second conductivity type in the semiconductor region and
source regions of a first conductivity type in upper portions of the well regions, wherein the well regions and the source regions are adjacent to the sidewalls of each trench, and wherein the concave-shaped salicide layer in each trench overlaps bottom portions of adjacent source regions along a depth of the trenches.

17. The trench-gate FET structure of claim 14, wherein portions of the gate dielectric layer extending over the mesa surfaces isolate the interconnect layer from the semiconductor region and the dielectric layer isolates the interconnect layer from the concave-shaped salicide layer.

18. The trench-gate FET structure of claim 14, wherein a top surface of the concave-shaped salicide layer in each trench is recessed relative to adjacent mesa surfaces.

19. The trench-gate FET structure of claim 14, further comprising:
a shield electrode in each trench under the gate electrode; and
an inter-electrode dielectric in each trench extending between the shield electrode and the gate electrode.

* * * * *

UNITED STATES PATENT AND TRADEMARK OFFICE
CERTIFICATE OF CORRECTION

PATENT NO.        : 8,143,125 B2                                              Page 1 of 1
APPLICATION NO.   : 12/412803
DATED             : March 27, 2012
INVENTOR(S)       : Purtell et al.

It is certified that error appears in the above-identified patent and that said Letters Patent is hereby corrected as shown below:

In the Claims

In column 7, line 18, in claim 1, delete "ill" and insert -- in --, therefor.

In column 8, line 36, in claim 10, delete "nickel." and insert -- nickel, --, therefor.

In column 9, line 10, in claim 16, after "region", insert -- ; --, therefor.

Signed and Sealed this
Twenty-sixth Day of November, 2013

Margaret A. Focarino
*Commissioner for Patents of the United States Patent and Trademark Office*